(12) United States Patent
Mockridge et al.

(10) Patent No.: US 6,876,543 B2
(45) Date of Patent: Apr. 5, 2005

(54) HOUSING FOR A COMMUNICATION DEVICE AND METHOD ASSEMBLING THE SAME

(75) Inventors: John B. Mockridge, Chicago, IL (US); Scott R. Wilcox, Gurnee, IL (US); Benjamin M. Finney, Barrington, IL (US); Mark D. Janninck, Glen Ellyn, IL (US)

(73) Assignee: Motorola, Inc., Schaumburg, IL (US)

( * ) Notice: Subject to any disclaimer, the term of this patent is extended or adjusted under 35 U.S.C. 154(b) by 117 days.

(21) Appl. No.: 10/383,599

(22) Filed: Mar. 7, 2003

(65) Prior Publication Data

US 2004/0174665 A1 Sep. 9, 2004

(51) Int. Cl.⁷ .................................................. G06F 1/16
(52) U.S. Cl. ....................... 361/679; 361/683; 361/752; 361/814; 455/90; 455/351; 455/575.1
(58) Field of Search ................................. 361/752–759, 361/796–801, 807–814; 379/428, 433, 447, 455, 426, 437, 454, 439, 445; 224/930; 40/546; 349/65; 220/4.02, 682; 383/59, 66, 106–113; 455/550.1, 575.1, 575.2, 575.3, 575.4, 575.5, 575.6–575.9, 351, 128, 347, 899

(56) References Cited

U.S. PATENT DOCUMENTS

| | | | | |
|---|---|---|---|---|
| 4,912,602 A | * | 3/1990 | Zurek et al. | ................. 361/752 |
| 5,233,506 A | * | 8/1993 | Semenik et al. | ............ 361/814 |
| 5,960,332 A | * | 9/1999 | Michalzik | ................. 455/575.1 |
| 6,111,760 A | * | 8/2000 | Nixon | ......................... 361/814 |
| 6,201,867 B1 | * | 3/2001 | Koike | ................... 379/433.11 |
| 2004/0053649 A1 | * | 3/2004 | Sun | ......................... 455/575.1 |

FOREIGN PATENT DOCUMENTS

WO    WO00/64127    * 10/2000    ............ H04M/1/02

* cited by examiner

Primary Examiner—Michael Datskovskiy
(74) Attorney, Agent, or Firm—Design IP

(57) ABSTRACT

A housing assembly for a communication device including front and rear housings and an endoskeleton adapted to be secured to the front housing via recesses locate on the endoskeleton and corresponding ribs located on the front housing. The front and rear housings include a cantilever arm and loop assembly to secure the top ends of the front and rear housings to each other. The rear housing includes a pair of hooks located at its bottom end and the second housing includes a pair of latches located at its bottom end. The hooks each have a contact surface adapted to mate with a corresponding contact surface on each latch. The contact surface on each hook are outwardly sloped and the contact surface on each latch is inwardly and downwardly sloped. The contact surface slopes cause the hooks to deflect inwardly when the latches are snapped into the hooks.

21 Claims, 6 Drawing Sheets

HOUSING FOR A COMMUNICATION DEVICE AND METHOD ASSEMBLING THE SAME

BACKGROUND OF THE INVENTION

The invention relates generally to the field of housings for communication devices.

Housings for portable electronic devices, such a mobile telephones, are known in the art. Such devices may include an internal tranceiver housing assembly, which contains the most of the functional components of the device and is often referred to the in the art as an "endoskeleton." The endoskeleton contains the display and electrical components. A protective shell or external housing, often referred to as an "exoskeleton," protects the endoskeleton, provides a pleasing appearance and provides an array of holes through which keypad keys protrude. Typically, the housing includes front and rear halves that envelope the exoskeleton when attached to each other.

More recently the front and/or rear halves have been provide that are designed to be assembled and/or replaced by the consumer. This allows the consumer to replace a damaged housing or simply replace all or part of the original housing with a housing having a different appearance. Such devices are ordinarily designed so that the lower portions of the front and rear housings must be assembled first, then the upper portions of the housings are rotated toward one another and latched together. The housings of the prior art provide only one method of assembly and are difficult to align during assembly. Accordingly, there is a need for an improved housing structure that will facilitate assembly of the device.

SUMMARY OF THE INVENTION

In one respect, the invention comprises a housing assembly for a communication device including a first housing having a bottom end and first and second hooks located at the bottom end. The first hook preferably includes a first contact surface and the second hook preferably includes a second contact surface. The assembly also includes a second housing having a bottom end and first and second latches located at the bottom end. The first latch preferably include a third contact surface and the second latch preferably includes a fourth contact surface. The first and second hooks are preferably adapted to deflect inwardly with respect to the first and second latches during assembly of the first and second housings.

An another respect, the invention comprises a housing for a communication device including a top end, a bottom end, opposing first and second side walls, and a first member that joins the a top end, bottom end, and first and second side walls. The housing also includes first and second hooks extending from the first and second side walls, respectively. The first and second hooks are preferably located at the bottom end of the housing. The first and second hooks each preferably have first and second contact surfaces that are both outwardly sloped and face the bottom end of the housing. The first contact surface are preferably adjacent to the second contact surface. The first and second hooks each preferably also have a hollow core.

BRIEF DESCRIPTION OF THE DRAWINGS

The present invention will hereinafter be described in conjunction with the appended drawing figures wherein like numerals denote like elements.

DETAILED DESCRIPTION OF THE PREFERRED EMBODIMENT(S)

Figure 1:
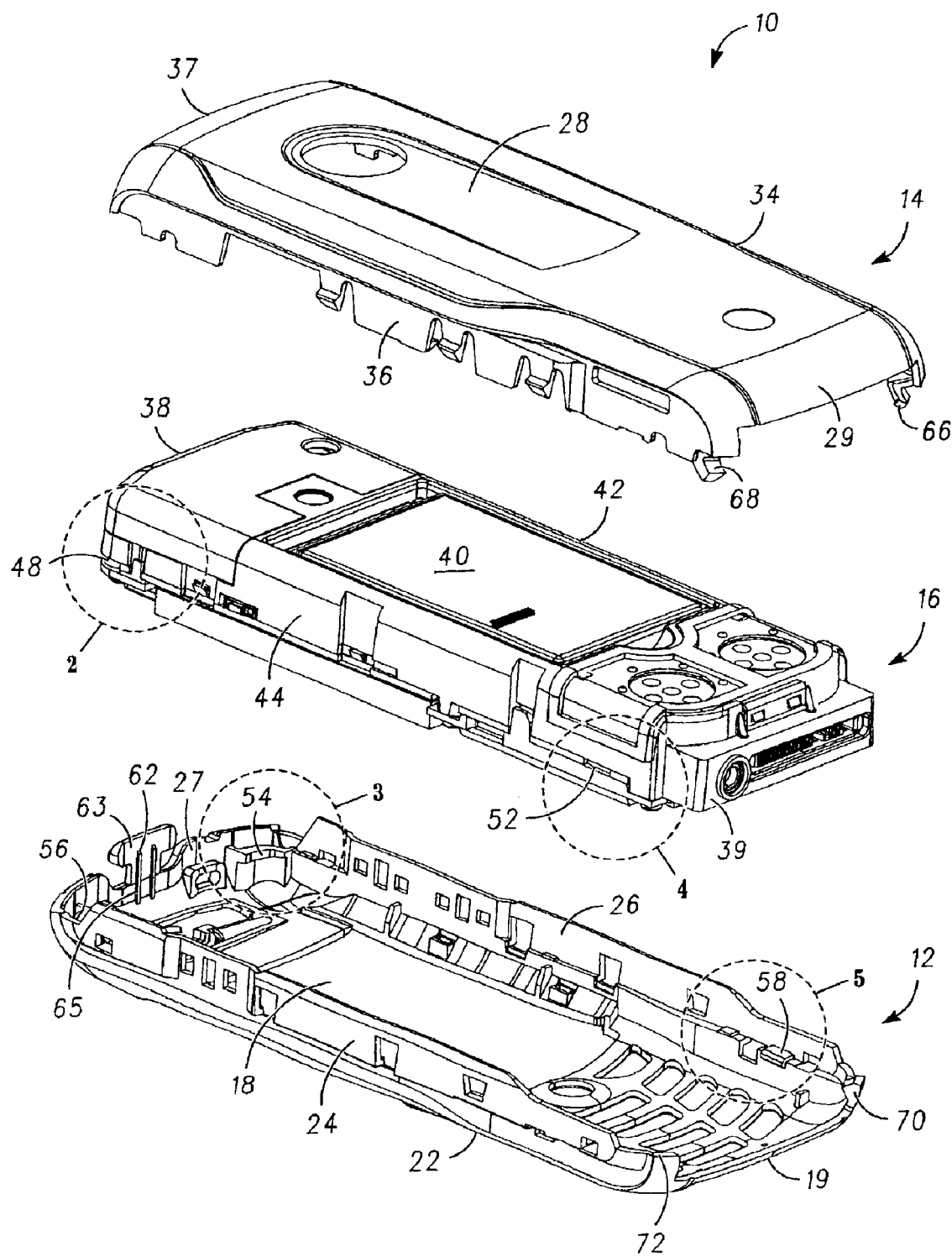
FIG. 1 is an exploded view showing the front housing, endoskeleton and rear housing of the present invention.

The ensuing detailed description provides preferred exemplary embodiments only, and is not intended to limit the scope, applicability, or configuration of the invention. Rather, the ensuing detailed description of the preferred exemplary embodiments will provide those skilled in the art with an enabling description for implementing the preferred exemplary embodiments of the invention. It being understood that various changes may be made in the function and arrangement of elements without departing from the spirit and scope of the invention, as set forth in the appended claims.

To aid in describing the invention, the left side of the telephone 10 is defined as the side of the telephone corresponding to reference numerals 24, 36 and 44, the right side is defined as the side corresponding to reference numerals 26, 34 and 42, the top end is defined as the side corresponding to reference numerals corresponding to reference numerals 27, 37 and 38, the bottom end is defined as the end corresponding to reference numerals 19, 29, and 39, the front side is defined as the side corresponding to reference numeral 22 (facing down in FIG. 1), and the rear side is defined as the side corresponding to reference numeral 28. These directional definitions are merely intended to assist in describing and claiming the invention and are not intended to limit the invention in any way.

In addition, reference numerals that are introduced in the specification in association with a drawing figure may be repeated in one or more subsequent figures without additional description in the specification in order to provide context for other features.

FIG. 1 shows a preferred embodiment of the mobile telephone 10 of the present invention, which includes an endoskeleton 16, a front housing 12 and a rear housing 14. In this embodiment, the front and rear housings 12, 14 and endoskeleton 16 are sized and configured for use as a mobile telephone 10. Other types of communication devices are, of course, within the scope of the invention and could include, two-way radios and cordless (non-mobile) telephones, for example.

The front housing 12 comprises a top end 27, a bottom end 19, a left side wall 24, and a right side wall 26, which are joined by and are generally perpendicular to a member 18 that forms the front face of the front housing 12. Similarly, the rear housing 14 comprises a top end 37, a bottom end 29, a left side wall 36 and right side wall 34, which are joined by and are generally perpendicular to a member 28 that forms the rear face of the rear housing 14. When the front and rear housings are assembled, these structures define a cavity in which the endoskeleton 16 is contained. The front and rear housings 12, 14 are preferably made from a durable rigid polymer, such as polycarbonate or a polycarbonate/ABS plastic blend. In this embodiment, Lexan™ polycarbonate, manufactured by General Electric, Inc., is used.

The endoskeleton 16 comprises a top end 38, bottom end 39, left side wall 44, a right side wall 42, a front surface (not visible) and a rear surface 40, which aggregately define a generally rectangular structure. As stated above, the endoskeleton 16 is an assembly that houses a transceiver and other functional components of the telephone, such as a microphone, speaker(s), a display, accessory jacks and the like.

The telephone 10 is designed be assembled by first attaching the endoskeleton 16 to either the front or rear housing 12, 14. Attachment to the front housing 12 is usually preferred because this enables the keypad (not shown) to be positioned and secured before the rear housing 14 is attached. In this embodiment, means for attachment of the endoskeleton 16 to the front housing 12 is provided by four recesses formed in the endoskeleton 16 which are engaged by corresponding ribs located on the front housing 12.

The recesses in the endoskeleton 16 comprise a top left recess 48, a top right recess (not visible), a bottom left recess 52 and a bottom right recess (not visible). The top right and bottom right recesses are located on the right side 42 of the endoskeleton 16 and are mirror images of top left recess 48 and bottom left recess 52, respectively.

Similarly, the ribs in the front housing 12 comprise a top left rib 56 (only partially visible in FIG. 1), a top right rib 54, a bottom left (not visible) and a bottom right rib 58. The top left rib 56 and the bottom left rib are located on the left side wall 24 of the front housing 12 and are mirror images of top right rib 54 and bottom right rib 58, respectively.

Figure 2:
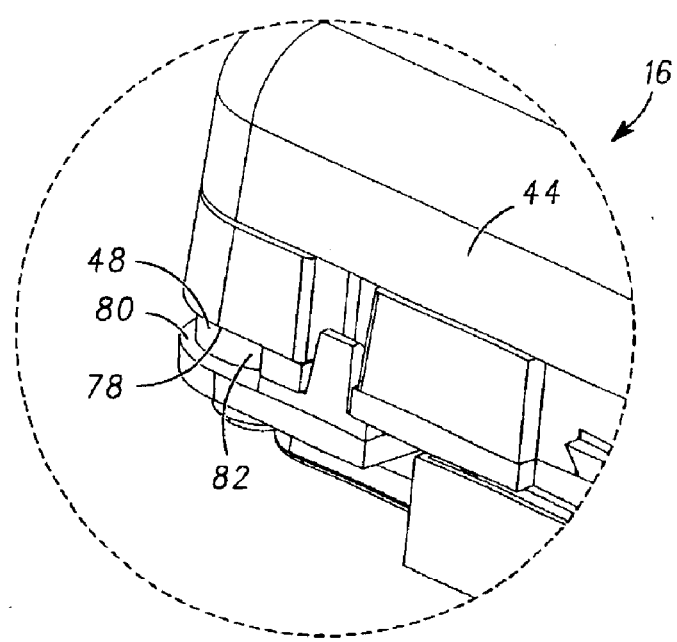
FIG. 2 is an enlarged partial view of the top left corner of the endoskeleton, showing the top left recess.
Figure 3:
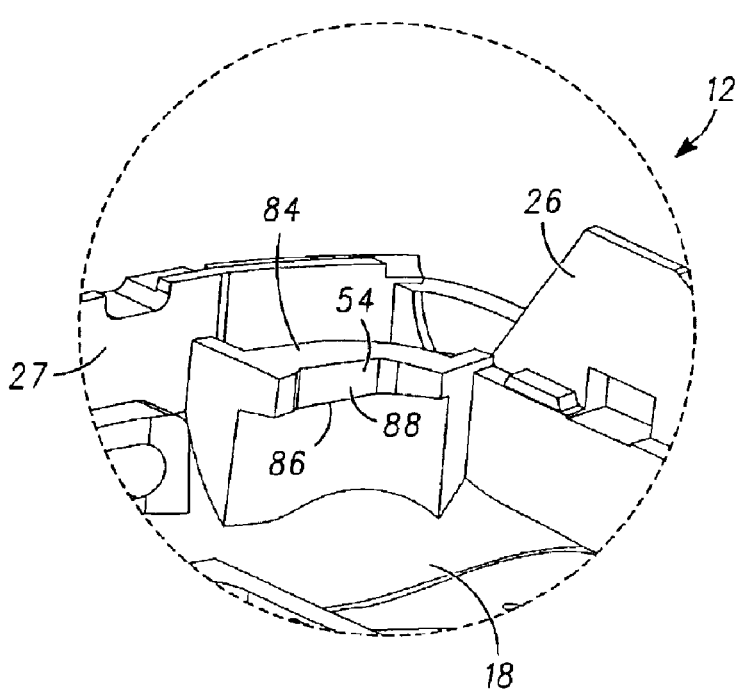
FIG. 3 is an enlarged partial view of the top right corner of the front housing, showing the top right rib.

The top left recess 48 and the top right rib 54 are shown in greater detail in FIGS. 2 and 3, respectively. The top left recess 48 comprises upper and lower edges 78, 80 and a convex face 82. The structure of the top right recess a mirror image of the top left recess 48. The top right rib 54 comprises planar top and bottom surfaces 84, 86 and a convex face 88, which is shaped to mate with the convex face of the top right recess.

Figure 4:
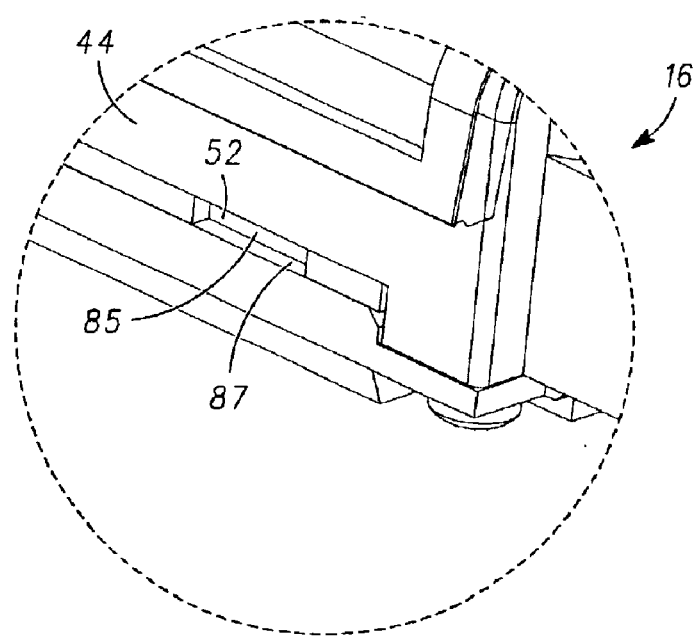
FIG. 4 is an enlarged partial view of the bottom portion of the endoskeleton, showing the bottom left recess.
Figure 5:
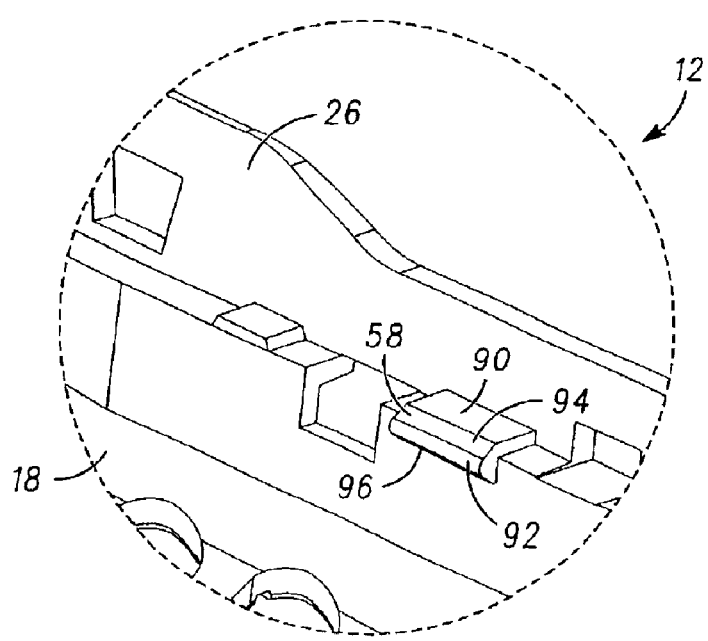
FIG. 5 is an enlarged partial view of the bottom portion of the front housing, showing the bottom right rib.

Referring now to FIGS. 4 and 5, the bottom left recess 52 and bottom right rib 58 are shown in greater detail. The bottom left recess 52 is generally rectangular and is defined by four walls 87 and a generally planar face 85. The bottom right recess is identical. The bottom right rib 58 comprises a planar top surface 90 and two opposing surfaces 94, 96 that taper to a face 92 which is preferably perpendicular to the top surface 90. The structure of the bottom left rib is a mirror image of the bottom right rib 58.

Returning to FIG. 1, attachment of the endoskeleton 16 to the front housing 12 is accomplished by aligning the endoskeleton 16 and front housing 12, then lowering the top end 38 of the endoskeleton 16 to insert the top left recess 48 and top right recess (not visible) into the top left rib 56 and top right rib 58, respectively. Then the bottom end 39 of the endoskeleton 16 is lowered toward the bottom end 19 of the front housing 12 until the bottom left recess 52 snaps into the bottom left rib (not visible) and the bottom right recess (not visible) snaps into the bottom right rib 58. As the left side wall 44 and right side wall 42 of the endoskeleton 16 pass over the bottom left rib (not visible) and bottom right rib 58, respectively, portions of the left and right walls 24, 26 adjacent to the bottom left rib and bottom right rib 58 flex outwardly, then return to their normal position when bottom recesses are snapped into the bottom left recess 52 and bottom right recess, respectively.

After the endoskeleton 16 is attached to the front housing 12, the rear housing 14 is then attached to the front housing 12. The means for attaching the front and rear housings 12, 14 will now be discussed in greater detail.

Figure 6:
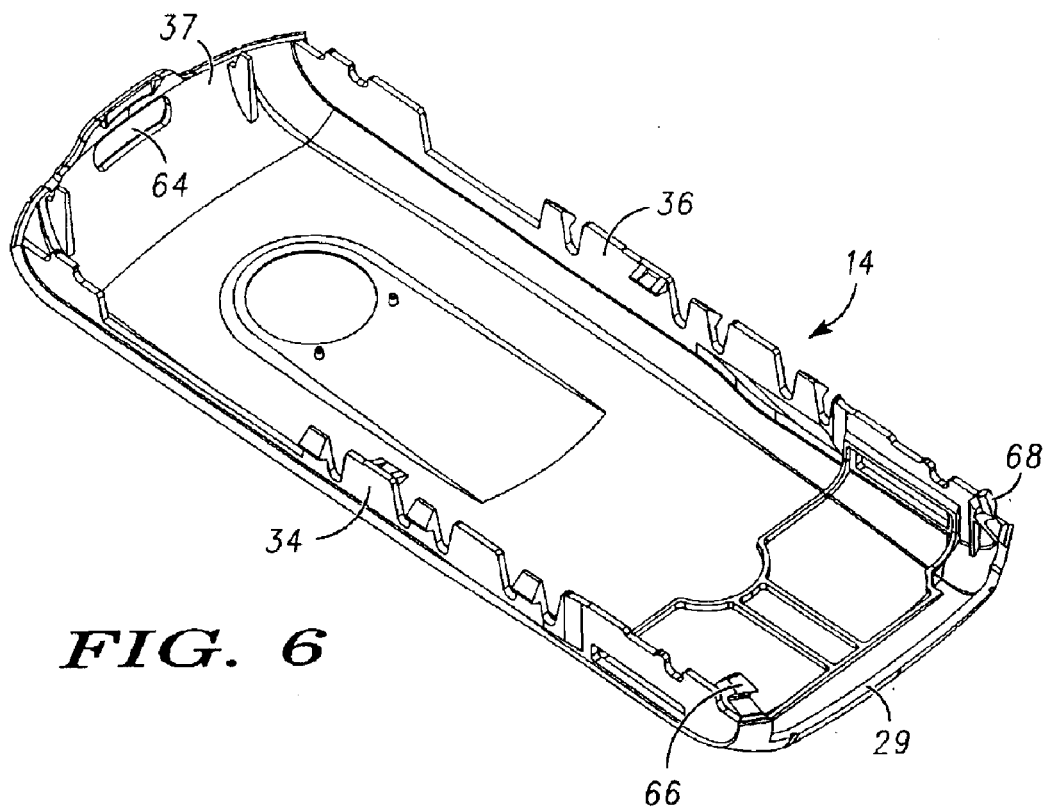
FIG. 6 is a perspective view showing the rear housing with the inner surface facing upward.

Referring again to FIG. 1, the top ends 27, 37 of the front and rear housings 12, 14 are secured by a latch assembly that includes a cantilever arm 62 on the front housing 12 and a loop 64 (see FIG. 6) on the rear housing 14. The cantilever arm 62 comprise an elongated oval head 63 which is connected to the top end 27 of the front housing 12 by an arm 65. The loop 64 (see FIG. 6) is an oval-shaped opening that is similar in shape and slightly larger than the head 63.

The bottom ends 19, 29 of the front and rear housings 12, 14 are secured by a latch assembly that includes two opposing pairs of hooks and latches. Left and right hooks 68, 66 are located at the bottom end 29 of the rear housing 14. Left and right latches 72, 70 are located at the bottom end 19 of the front housing 12.

Figure 7:
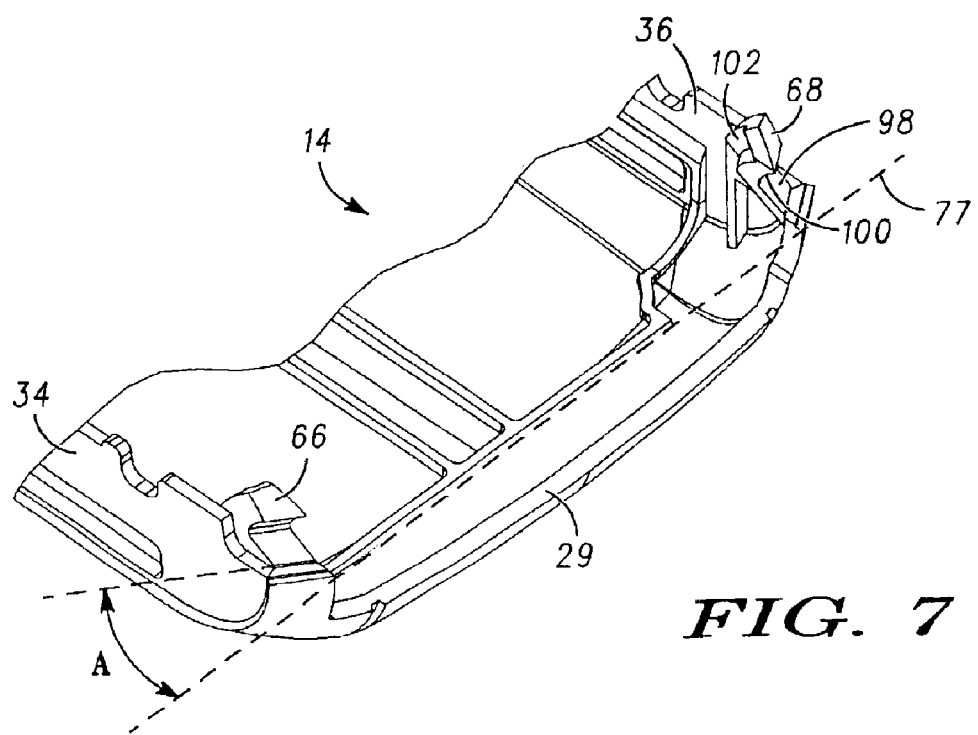
FIG. 7 is an enlarged partial view of the bottom end of the rear housing.

The hooks 68, 66 are shown in greater detail in FIG. 7. The right hook 66 is a mirror image of the left hook 68. Accordingly, the structural features of the only the left hook 68 are described in full detail. The left hook 68 comprises a lower and upper contact surfaces 98, 100, which face the bottom end 29 of the rear housing 14 and are designed to engage corresponding surfaces on the left latch 72 (described in detail below). The left hook 68 also preferably includes a hollow core 102 located on the opposite side of the hook 68 from the contact surfaces 98, 100. Making the core 102 hollow facilitates inward deflection of the hook 68 (the significance of which is discussed below), provides a more uniform wall thickness and allows for easier plastic flow characteristics during fabrication.

Figure 8:
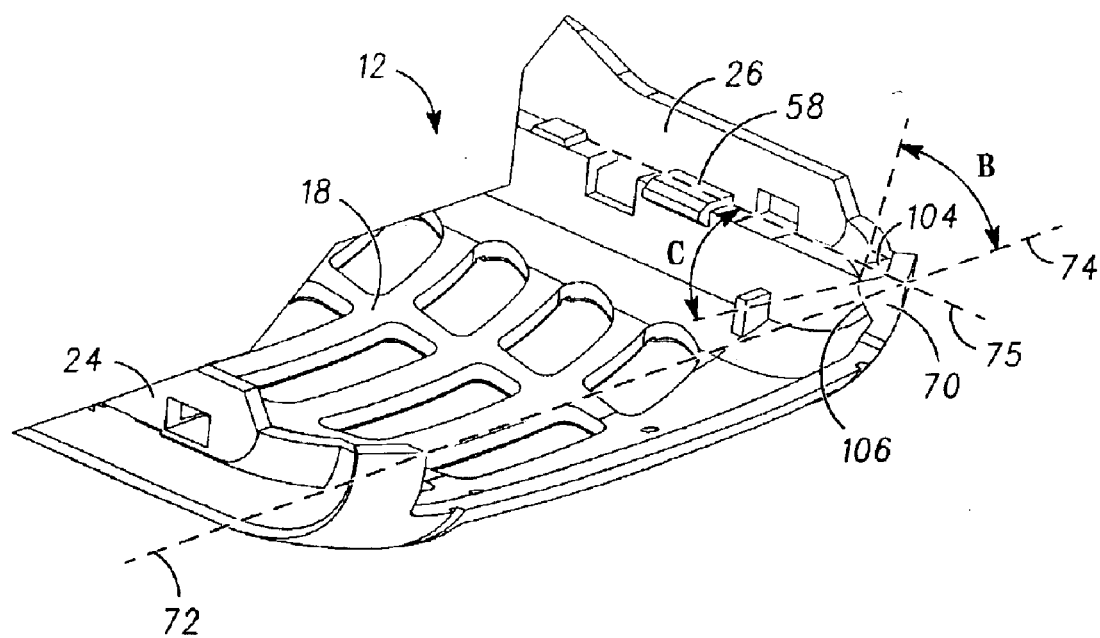
FIG. 8 is an enlarged partial view of the bottom end of the front housing.
Figure 9:
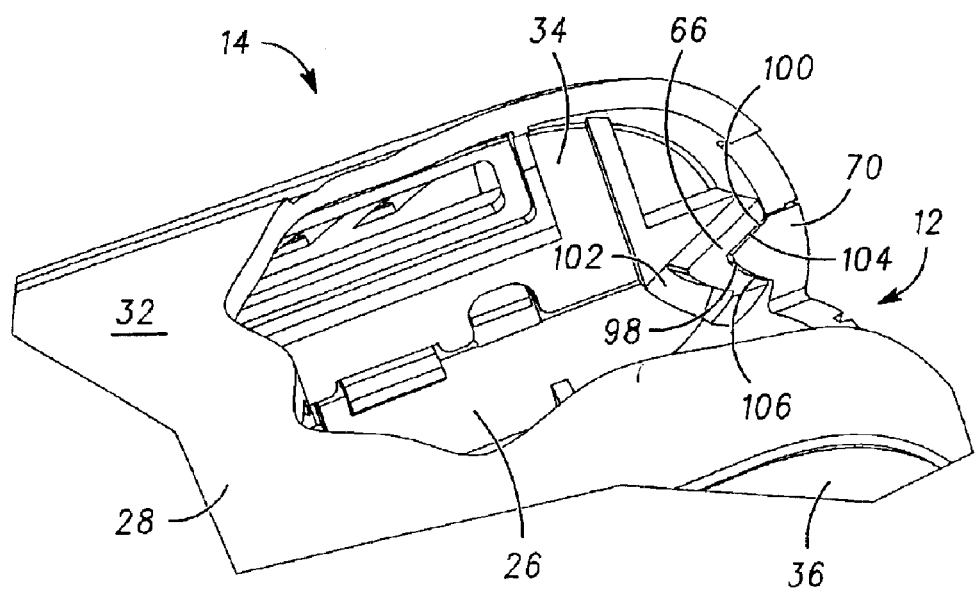
FIG. 9 is an enlarged partial view of the bottom ends of the front and rear housings in an assembled position, shown with a portion of the rear housing cut away.

The latches 72, 70 are shown in greater detail in FIG. 8. The left latch 72 is a mirror image of the right latch 70. Accordingly, the structural features of the only the right latch 70 are described in full detail. The right latch 70 comprises upper and lower surfaces 104, 106, which are shaped to mate with the upper and lower surfaces 98, 100, respectively, of the right hook 66. FIG. 9 shows the right hook 66 and right latch 70 in an engaged position.

Figure 11:
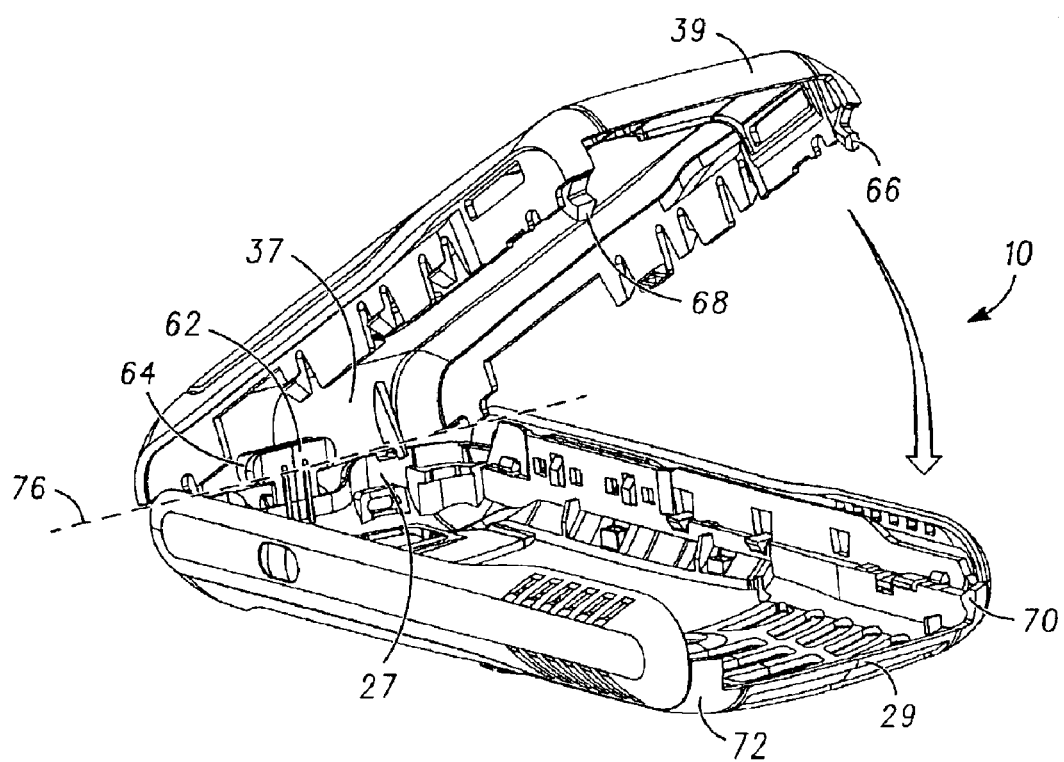
FIG. 11 is a perspective view showing one stage of another method of assembling the front and rear housings in accordance with the present invention. The endoskeleton is omitted from FIG. 11.

In order to facilitate assembly and to enable a second assembly method (described below), the contact surfaces 98, 100 of the left hook 68 are sloped outwardly, and the contact surfaces 104, 106 of the right latch 70 are sloped inwardly. The amount of slope for each of these surfaces can be described relative to a transverse axis 74 (see FIGS. 7 and 8), which is perpendicular to the side walls 24, 26 of the front housing 12, the side walls 34, 36 of the rear housings 14 and the direction of movement (represented by the arrow in FIG. 11) of the rear housing 14 during the second method of assembly (described in detail below).

In this embodiment, the slope of the contact surfaces 98, 100 of the right hook 66 is shown in FIG. 7 and is represented by angle A. The angle A in this embodiment is about 55 degrees and the preferred slope range (relative to the transverse axis 77, which is the same as the assembly axis 74 of the first method of assembly) is about 35 to 75 degrees. The left hook 68 slopes outwardly at the same angle as the right hook 66. The outward slopes of the left and right hooks 68, 66, respectively, promote outward deflection of the left and right latches 72, 70 respectively during assembly.

Similarly, the slope of the contact surfaces 104, 106 of the right latch 70 is shown in FIG. 8 and is represented by angle B. The angle B in this embodiment is 55 degrees and the preferred slope range (relative to the transverse axis 77) is about 35 to 75 degrees. The upper contact surface 104 also slopes downwardly at an angle C relative to the longitudinal axis 75 of the front housing 12. The angle C in this embodiment is 28 degrees and the preferred slope range (relative to the transverse axis 75) is about 25 to 60 degrees. The left latch 72 slopes inwardly and downwardly at the same angles as the right latch 70. The inward and downward slopes of the left and right latches 72, 70 promote inward deflection of the left and right hooks 68, 66, respectively during assembly.

Figure 10:
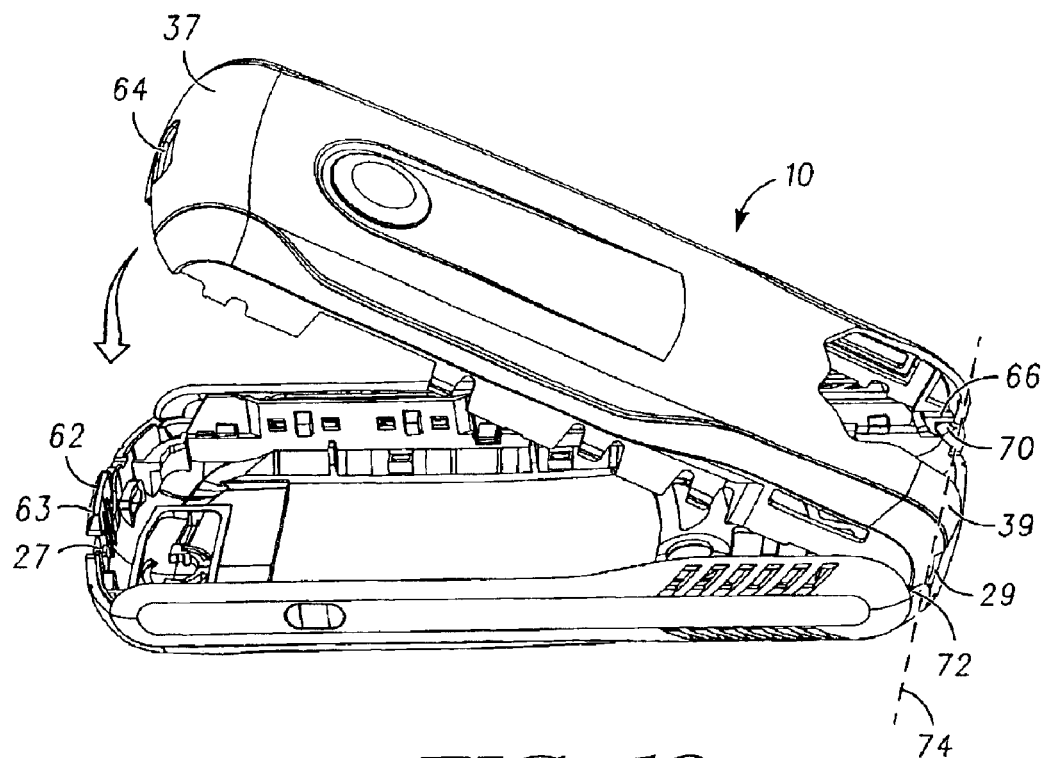
FIG. 10 is a perspective view showing one stage of one method of assembling the front and rear housings in accordance with the present invention. The endoskeleton is omitted from FIG. 10.

The front and rear housings 12, 14 can be assembled using two different methods. The first method is shown in FIG. 10. According to the first assembly method, the hooks 68, 66 (hook 66 is not visible in FIG. 10) and latches 70, 72 are first engaged, then the top ends 27, 37 of the front and rear housings 12, 14 are rotated toward one another about an assembly axis 74 until the head 63 of the cantilever arm 62 snaps into the loop 64. This is the typical assembly method used in the prior art.

According to the second assembly method (FIG. 11) the cantilever arm 62 and loop 64 are engaged first, then the bottom ends 29, 39 of the front and rear housings are rotated toward one another about an assembly axis 76 until each of the latches 72, 70 are snapped into respective hooks 68, 66.

As described above, the sloped surfaces of the hooks 68, 66 and the latches 72, 70 allow enable assembly of the front and rear housings 12, 14 by either of the methods described above. If these surfaces were not sloped in the manner described, proper alignment of the front and rear housings 12, 14 under the first assembly method would be much more difficult and assembly by the second assembly method would be very difficult or impossible.

While the principles of the invention have been described above in connection with preferred embodiments, it is to be clearly understood that this description is made only by way of example and not as a limitation of the scope of the invention.

What is claimed is:

1. A housing assembly for a communication device comprising:
   a first housing having first and second side walls, a bottom end, first transverse axis that is perpendicular to the first and second side walls, and first and second engaging members located at the bottom end, the first engaging member including a first contact surface and the second engaging member including a second contact surface; and
   a second housing having third and fourth side walls, a bottom end, a second transverse axis that is perpendicular to the third and fourth side walls, and third and fourth engaging members located at the bottom end, the third engaging member including a third contact surface and the fourth engaging member including a fourth contact surface;
   wherein the first and second contact surfaces are oblique to the first and second side walls and the first transverse axis, the third and fourth contact surfaces are oblique to the third and fourth side walls and the second transverse axis, the first and second contact surfaces slope outwardly with respect to the first transverse axis, and the third and fourth contact surfaces slope inwardly with respect to the second transverse axis.

2. The assembly of claim 1, wherein the first and second contact surfaces mate with the third and fourth contact surfaces, respectively, when the first and second housings are assembled.

3. The assembly of claim 1, wherein the first and second contact surfaces are adapted to deflect inwardly with respect to the third and fourth engaging members during assembly of the first and second housings.

4. The assembly of claim 1, wherein the outward slope of each of the first and second contact surfaces is between 35 and 70 degrees.

5. The assembly of claim 1, wherein the third and fourth contact surfaces are inwardly sloped.

6. The assembly of claim 5, wherein the inward slope of each of the third and fourth contact surfaces is between 35 and 70 degrees.

7. The housing of claim 4, wherein the third and fourth surfaces are downwardly sloped.

8. The assembly of claim 4, wherein the downward slope of each of the third and fourth contact surfaces is between 25 and 60 degrees.

9. The assembly of claim 1, wherein the third and fourth contact surfaces are complimentary in shape to the first and second contact surfaces, respectively.

10. The assembly of claim 9, wherein both the first contact surfaces are convex and both the third and fourth contact surfaces are concave.

11. The housing of claim 2, wherein the first housing further comprises fifth and sixth contact surfaces, the second housing further comprises seventh and eighth contact surfaces, and the fifth and sixth contact surfaces mate with the seventh and eighth contact surfaces, respectively, when the first and second housings are assembled.

12. The assembly of claim 1, wherein the first engaging member includes a first hollow core opposite the first contact surface and the second engaging member includes a second hollow core opposite the second contact surface.

13. The assembly of claim 1, wherein:
   the first housing further comprises a top end that is distal to the bottom end of the first housing and a cantilever arm located at the top end of the first housing, the cantilever arm includes a head that as connected to the top end of the first housing by arm; and
   the second housing further comprises a top end that is distal to the bottom end of the second housing and an opening located at the top end, the opening being shaped to receive the head;
   wherein the arm is biased to force the head into the opening of the second housing when the first and second housings are assembled.

14. A housing assembly for a communication device comprising:
   a first housing having a bottom end and first and second engaging members located at the bottom end, the first engaging member including a first contact surface and the second engaging member including a second contact surface; and a second housing having a bottom end and third and fourth engaging members located at the bottom end, the third engaging member including a third contact surface and the fourth engaging member including a fourth contact surface;

wherein the first and second engaging members are adapted to deflect inwardly with respect to the third and fourth engaging members during assembly of the first and second housings; and wherein the second housing further comprises first and second ribs located at the top end of the second housing protruding toward the bottom end of the second housing and third and fourth ribs located between the top end and the bottom end of the second housing, the third rib being located opposite the fourth rib.

15. The assembly of claim 14, wherein the first and second ribs each include a concave face, the third and fourth ribs each including a planar face.

16. The assembly of claim 15, wherein the first and second ribs are shaped and located to be received into first and second recesses, respectfully, located on an endoskeleton and the third and fourth ribs are shaped and located to snap into third and fourth recesses located on the endoskeleton.

17. A method of assembling a housing assembly for a communication device including a first housing having top and bottom ends, first and second engaging members located at the bottom end, and an opening located at the top end, and a second housing having top and bottom ends, third and fourth engaging members located at the bottom end, and a cantilever arm including a head located at the top end, the method comprising:

engaging the first and second engaging members to the third and fourth engaging members, respectively;

after the engaging step, rotating the top end of the first housing toward the top end of the second housing until the head of the second housing is snaps into the opening of the first housing.

18. A method of assembling a housing assembly for a communication device including a first housing having top and bottom ends, first and second engaging members located at the bottom end, and an opening located at the top end, and a second housing having top and bottom ends, third and fourth engaging members located at the bottom end, and a cantilever arm including a head located at the top end, the method comprising:

rotating the top end of the first housing toward the top end of the second housing until the head of the second housing is snaps into the opening of the first housing;

after the rotating step, first and second engaging members to the third and fourth engaging members, respectively.

19. The method of claim 18, further comprising deflecting the first and second engaging members inwardly after the rotating step.

20. The method of claim 18, further comprising assembling an endoskeleton to the second housing before the rotating step.

21. A housing assembly for a communication device comprising:

a first housing having a bottom end and first and second engaging members located at the bottom end, the first engaging member including a first contact surface and the second engaging member including a second contact surface; and a second housing having a bottom end and third and fourth engaging members located at the bottom end, the third engaging member including a third contact surface and the fourth engaging member including a fourth contact surface;

wherein the first and second engaging members are adapted to deflect inwardly with respect to the third and fourth engaging members during assembly of the first and second housings;

wherein the third and fourth contact surfaces are complimentary in shape to the first and second contact surfaces, respectively; and wherein both the first and second contact surfaces are convex and both the third and fourth contact surfaces are concave.

* * * * *